United States Patent
Wang et al.

(10) Patent No.: US 11,616,124 B2
(45) Date of Patent: *Mar. 28, 2023

(54) METHOD OF MAKING FIN FIELD EFFECT TRANSISTOR (FINFET) DEVICE

(71) Applicant: TAIWAN SEMICONDUCTOR MANUFACTURING COMPANY, LTD., Hsinchu (TW)

(72) Inventors: Jhong-Sheng Wang, Hsinchu (TW); Jiaw-Ren Shih, Hsinchu (TW); Chun-Wei Chang, Hsinchu (TW); Sheng-Feng Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 200 days.

This patent is subject to a terminal disclaimer.

(21) Appl. No.: 17/207,066

(22) Filed: Mar. 19, 2021

(65) Prior Publication Data
US 2021/0226012 A1 Jul. 22, 2021

Related U.S. Application Data

(63) Continuation of application No. 16/042,300, filed on Jul. 23, 2018, now Pat. No. 11,107,889, which is a
(Continued)

(51) Int. Cl.
*H01L 29/10* (2006.01)
*H01L 29/06* (2006.01)
(Continued)

(52) U.S. Cl.
CPC .... *H01L 29/1037* (2013.01); *H01L 21/26586* (2013.01); *H01L 21/308* (2013.01);
(Continued)

(58) Field of Classification Search
CPC ............. H01L 29/7851; H01L 29/1037; H01L 29/0653; H01L 29/66795; H01L 29/6681;
(Continued)

(56) References Cited

U.S. PATENT DOCUMENTS 7,101,763 B1 9/2006 Anderson et al.
8,426,283 B1 * 4/2013 Wang ................ H01L 29/66795
257/346
(Continued)

*Primary Examiner* — Mohsen Ahmadi
(74) *Attorney, Agent, or Firm* — Hauptman Ham, LLP

(57) ABSTRACT

A method of making a semiconductor device includes defining a first fin structure over a major surface of a substrate, wherein the first fin includes a first material. The method includes defining a second fin structure over the major surface of the substrate. Defining the second fin structure includes forming a lower portion of the second fin structure, closest to the substrate, having the first material, and forming an upper portion of the second fin structure, farthest from the substrate, having a second material different from the first material. The method includes forming a dielectric material over the substrate and between the first and second fin structures. The method includes removing the upper portion of the second fin structure, wherein removing the upper portion of the second fin structure includes reducing a height of the second fin structure to be less than a height of the first fin structure.

15 Claims, 11 Drawing Sheets

Related U.S. Application Data continuation of application No. 15/238,904, filed on Aug. 17, 2016, now Pat. No. 10,032,869.

(51) Int. Cl.
*H01L 29/78* (2006.01)
*H01L 21/265* (2006.01)
*H01L 21/306* (2006.01)
*H01L 21/3065* (2006.01)
*H01L 21/308* (2006.01)
*H01L 21/762* (2006.01)
*H01L 29/66* (2006.01)
*H01L 21/266* (2006.01)

(52) U.S. Cl.
CPC .... *H01L 21/3065* (2013.01); *H01L 21/30625* (2013.01); *H01L 21/76224* (2013.01); *H01L 29/0653* (2013.01); *H01L 29/6681* (2013.01); *H01L 29/66803* (2013.01); *H01L 29/66818* (2013.01); *H01L 29/7851* (2013.01); *H01L 29/7853* (2013.01); *H01L 29/7854* (2013.01); *H01L 21/266* (2013.01); *H01L 21/26513* (2013.01)

(58) Field of Classification Search
CPC ........... H01L 29/7853; H01L 21/76224; H01L 21/8234; H01L 21/845
See application file for complete search history.

(56) References Cited

U.S. PATENT DOCUMENTS

| | | | |
|---|---|---|---|
| 8,940,602 B2 | 1/2015 | Basker et al. | |
| 9,053,982 B2 | 6/2015 | Brink et al. | |
| 9,236,308 B1 | 1/2016 | Sung et al. | |
| 9,287,385 B2 | 3/2016 | Liu et al. | |
| 9,337,101 B1 | 5/2016 | Sung et al. | |
| 9,385,189 B1* | 7/2016 | Sung | H01L 29/1054 |
| 9,548,216 B1 | 1/2017 | Chen et al. | |
| 9,659,810 B2* | 5/2017 | Yin | H01L 21/76229 |
| 9,691,763 B2 | 6/2017 | Basker et al. | |
| 9,735,165 B1 | 8/2017 | Adusumilli et al. | |
| 9,905,467 B2* | 2/2018 | Li | H01L 21/311 |
| 10,002,924 B2* | 6/2018 | Balakrishnan | H01L 29/1054 |
| 2008/0265338 A1* | 10/2008 | Yu | H01L 29/66795 257/397 |
| 2009/0278196 A1* | 11/2009 | Chang | H01L 27/1203 438/440 |
| 2009/0321836 A1 | 12/2009 | Wei et al. | |
| 2010/0015778 A1* | 1/2010 | Lin | H01L 29/66795 257/E21.54 |
| 2014/0193963 A1* | 7/2014 | Godet | H01L 29/66795 438/424 |
| 2014/0367795 A1* | 12/2014 | Cai | H01L 29/7851 438/275 |
| 2015/0035568 A1 | 2/2015 | Peng et al. | |
| 2015/0137308 A1 | 5/2015 | Akarvardar et al. | |
| 2015/0145068 A1 | 5/2015 | Chen et al. | |
| 2015/0187753 A1 | 7/2015 | Campi, Jr. et al. | |
| 2015/0200141 A1 | 7/2015 | Zhu | |
| 2015/0249127 A1 | 9/2015 | Xie et al. | |
| 2015/0303305 A1* | 10/2015 | Ching | H01L 29/6681 257/192 |
| 2015/0340381 A1* | 11/2015 | Ramachandran | H01L 21/762 438/424 |
| 2016/0005866 A1 | 1/2016 | Wu et al. | |
| 2016/0071737 A1* | 3/2016 | Hsu | B24B 37/20 438/692 |
| 2016/0308058 A1* | 10/2016 | Cheng | H01L 29/0653 |
| 2016/0315147 A1* | 10/2016 | Leobandung | H01L 21/823481 |
| 2016/0329253 A1* | 11/2016 | Liu | H01L 27/1211 |
| 2017/0033190 A1 | 2/2017 | Xie et al. | |
| 2017/0033194 A1* | 2/2017 | Chen | H01L 29/7851 |
| 2017/0069504 A1 | 3/2017 | Li et al. | |
| 2017/0069543 A1 | 3/2017 | Chang et al. | |
| 2017/0076973 A1* | 3/2017 | Lee | H01L 29/24 |
| 2017/0098582 A1* | 4/2017 | Yin | H01L 21/823821 |
| 2017/0133486 A1 | 5/2017 | Zhou | |
| 2017/0140992 A1* | 5/2017 | Chang | H01L 21/823418 |
| 2017/0148681 A1 | 5/2017 | Basker et al. | |
| 2017/0170174 A1 | 6/2017 | Chang et al. | |
| 2017/0179129 A1* | 6/2017 | Li | H01L 29/785 |
| 2017/0200809 A1* | 7/2017 | Li | H01L 29/36 |
| 2017/0213912 A1* | 7/2017 | Lin | H01L 29/7849 |
| 2017/0358662 A1* | 12/2017 | Chi | H01L 29/7853 |

\* cited by examiner

US 11,616,124 B2

METHOD OF MAKING FIN FIELD EFFECT TRANSISTOR (FINFET) DEVICE

PRIORITY CLAIM

The present application is a continuation of U.S. application Ser. No. 16/042,300, filed Jul. 23, 2018, which is a continuation of U.S. application Ser. No. 15/238,904, filed Aug. 17, 2016, now U.S. Pat. No. 10,032,869, issued Jul. 24, 2018, which are incorporated herein by reference in their entireties.

BACKGROUND

High performance integrated circuits typically generate significant amounts of heat during operation as current flows through transistors in active portions of the integrated circuit. Active cooling of chips and chip packages containing integrated circuits reduces the onset of thermal-induced breakdown of integrated circuit elements and prolongs the useful lifetime of such integrated circuits. Some types of integrated circuit degradation include hot carrier injection (HCI), time-dependent dielectric breakdown (TDDB), and electromigration of metallic components. The thermal exposure of integrated circuits (ICs) and IC packages during circuit manufacturing and operation can also impact the overall IC lifetime.

Refinements to manufacturing techniques reduce defects that lead to premature circuit aging. Such techniques relate to deposition of films for gate electrode formation and methods of forming gate electrodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
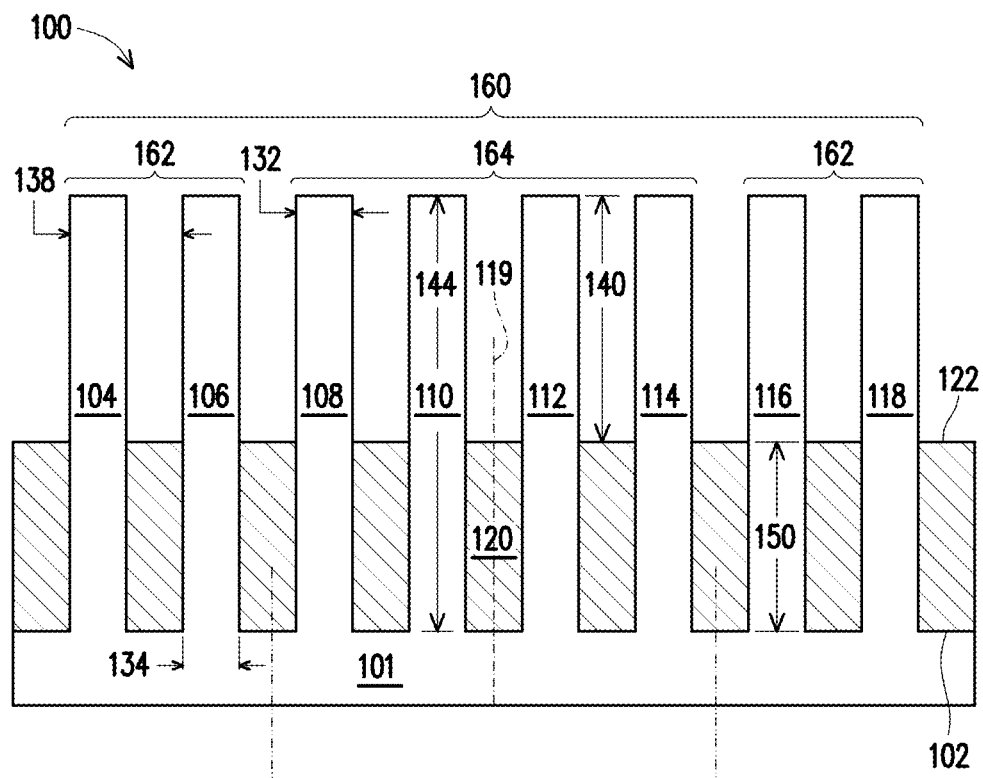
FIG. 1A is a cross-sectional view of a semiconductor device in accordance with some embodiments.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Semiconductor device aging results from an integrated circuit being exposed to, inter alia, elevated temperatures in some instances. Aging effects also result from cumulative exposure to an electrical current. Hot carrier injection (HCI), time-dependent dielectric breakdown (TDDB), bias threshold instability (BTI) and electromigration of metallic lines are some examples of aging-related integrated circuit breakdown. Some aging-related device breakdown, such as hot carrier injection, becomes more pronounced when integrated circuits are exposed to elevated temperatures.

Cooling of integrated circuit packages on circuit boards reduces heat exposure of integrated circuits on a macro scale. However, such macro-scale integrated circuit cooling does not address micro-scale imbalances in heat generation within integrated circuits. As channels of semiconductor devices, such as fin field effect transistors (FinFETs), conduct current during operation of integrated circuits, heat is generated due to resistance to the current moving through the channel. In a FinFET having fins of similar size in edge and center positions of a set of fins, as the FinFET generates heat during circuit operation, heat generated by fins near a center of a FinFET has difficulty escaping the bounds of the FinFET in the integrated circuit due to the aspect ratio of the fin and a close proximity of adjacent fins. In contrast, heat generated by the fins of the FinFET near an edge of the FinFET is able to radiate away from the FinFET easier than the fins in the center of a FinFET fin array. The edge fins of the FinFET array are able to radiate heat at a higher rate because of a larger distance between the edge fins and fins of an adjacent FinFET in comparison with the distance between adjacent fins in an interior of a same FinFET.

Aging effects such as HCI, TDDB, and BTI depend on temperature exposure over time. Individual fins in a FinFET experience different temperatures during operation. Fins that experience higher temperatures are more prone to aging effects. Adjusting individual fins to regulate an amount of heat each fin generates adjusts the profile of heat generation across the FinFET in the semiconductor device. Modifying a thermal profile of heat generation, such as by decreasing an amount of heat generated by the center fins of a semiconductor device, compared to the edge fins, creates a more uniform thermal profile that is less likely to undergo aging-related breakdown when compared to FinFETs that do not include fin modification. Semiconductor devices which experience lower temperatures, both overall temperature and localized temperature (within the semiconductor device), are able to forestall or avoid aging effects related to HCI, TDDB, and BTI better than semiconductor devices that experience higher temperatures and non-uniform temperature distribution within the semiconductor device.

FIG. 1A is a cross-sectional view of a semiconductor device 100 in accordance with some embodiments. Semiconductor device 100 is a FinFET having a substrate 101. Substrate 101 has a substrate major surface 102. Semiconductor device 100 contains includes fins 104, 106, 108, 110, 112, 114, 116, and 118 distributed around a center 119 of set of fins 160. Fins 104, 106, 108, 110, 112, 114, 116, and 118 include a fin semiconductor material and extend away a substrate 101. According to some embodiments, fins 104, 106, 108, 110, 112, 114, 116, and 118 include a same material as substrate 101. In some embodiments, at least one of fins 104, 106, 108, 110, 112, 114, 116, and 118 includes a material that is different from substrate 101. A dielectric material 120 is over substrate major surface 102 and between adjacent fins of the set of fins 160. In some embodiments, substrate major surface 102 is the top surface of the substrate 101 on which a fin semiconductor material is deposited. In some embodiments, substrate major surface 102 is a surface of the substrate 101 exposed after an etching process to form fins from a substrate material.

Fins of set of fins 160 have a fin pitch 138 and a starting fin height 144. Starting fin height 144 is measured from substrate major surface 102 to a top most surface of the fins of set of fins 160. While semiconductor device 100 includes eight fins in set of fins 160, a number of fins in set of fins 160 is different in some embodiments. A number of fins in set of fins 160 is selectable based on design parameters of semiconductor device 100, such as operating voltage. Fins in set of fins 160 are sometimes divided into subsets of fins according to the location of the fins within set of fins 160. According to some embodiments, subset of fins is divided into first subset of fins 164, located at a center of set of fins 160, and second subset of fins 162, where one portion of second subset of fins 162 is on one side of first subset of fins 164, and a second portion of second subset of fins 162 is located on an opposite side of first subset of fins 164.

Dielectric material 120 is against sides of each fin in set of fins 160 and on substrate 101. Dielectric material 120 has a first thickness 150 measured from substrate major surface 102 to a dielectric material top side 122. The first thickness 150 is against the sides of the fins in set of fins 160. Each fin in set of fins 160 has an initial top fin width 132 measured along the top most surface of the corresponding fin and a bottom fin width 134 measured against or near the substrate 101. Initial top fin width 132 and bottom fin width 134 are equal in some embodiments. The fins in set of fins 160 have an exposed fin height 140 measured from a dielectric material top side 122 to the top surface of the fins in the set of fins 160.

Figure 1B:
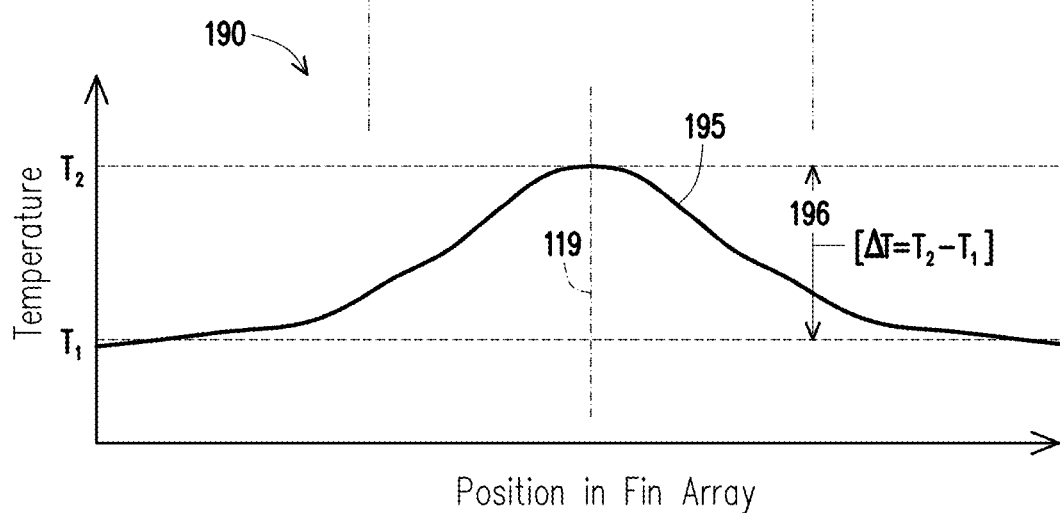
FIG. 1B is a graph of a thermal profile for a set of fins of a fin field effect transistor (FinFET) during operation of the FinFET, according to some embodiments.

FIG. 1B is a thermal profile chart 190 for set of fins 160 of a fin field effect transistor (FinFET) during operation of the FinFET, according to some embodiments. Thermal profile chart 190 includes a plot 195 aligned with center 119 of set of fins 160. Plot 195 indicates that a temperature $T_2$ of fins located closer to a center of semiconductor device 100 is greater than a temperature $T_1$ of fins located near an edge of semiconductor device 100. The difference in temperature 196 ($\Delta T$, where $\Delta T=T_2-T_1$) is a result of heat generated by each fin of set of fins 160 during operation of the integrated circuit.

Heat generated by fins near the center of set of fins 160 (first subset of fins 164, according to some embodiments) is more difficult to dissipate than heat generated by fins near the edge of set of fins 160 (second subset of fins 162). Fins in set of fins 160 are equally able to dissipate heat downward into the substrate 101 at similar rates because the temperature gradient between the surface and the bulk of the substrate material is similar for all fins. However, fins near the edges of set of fins 160 are able to dissipate heat laterally into surrounding materials or into an ambient environment faster than fins near the center of set of fins 160. The temperature gradient between the edge fins and surrounding materials and structures is greater than the temperature gradient between center fins and edge fins of set of fins 160. Thus, fins near the edge of set of fins 160 run "cooler" than the "hotter" center fins of set of fins 160 because they have a greater temperature gradient for dissipating heat. Accordingly, the "hotter" central fins are at a higher risk of undergoing aging-related breakdown processes. A non-uniform temperature distribution (such as higher temperatures in the center, lower temperatures at the edge) in a set of fins 160 makes the fins at the center of set of fins 160 more likely to experience aging effects than edge fins in set of fins 160. In some embodiments, $\Delta T$ between center and edge fins ranges from about 10° C. to about 100° C. In some embodiments, reliability of semiconductor devices such as semiconductor device 100 begins to degrade with $\Delta T$ as low as 20° C.

Tuning of heat generated by a semiconductor device is accomplished by adjusting a resistance of a channel of the fin to a current passing through the channel. In some embodiments, the resistance of the channel is adjusted by changing a threshold voltage of the fin. In some embodiments, conductivity characteristics of a semiconductor device fin are changed by adjusting a size or a shape of fins in set of fins 160 to form a set of modified fins. When a set of modified fins is formed, the amount of current that flows through each fin alters the heat generated by that fin in operation (as compared to a set of fins 160).

According to some embodiments of semiconductor devices with sets of modified fins, edge fins of a set of modified fins are adjusted to have smaller threshold voltages and allow larger currents to flow through the channel than center fins of a set of modified fins. A semiconductor device including modified fins has a more uniform temperature profile in comparison with other semiconductor devices that do not include modified fins. The increase in uniformity of the temperature profile for semiconductor devices having modified fins results in more uniform aging effects of the fins within the semiconductor device.

In some embodiments, a doping characteristic is modified by adjusting a dopant profile or doping characteristics of fins in set of fins 160. In some embodiments, a conductivity characteristic is adjusted by altering dopant types or dopant concentrations in fins of a FinFET while the FinFET fins are being manufactured. Adjusting dopant concentrations or dopant types in fins modifies the resistance and conductivity of a channel region and the amount of current that flows through the fins of a semiconductor device during operation. In some embodiments, a dopant concentration is adjusted to a higher concentration in some fins of set of fins 160 when making the set of modified fins. According to some embodiments, a dopant profile for a set of modified fins will differ from a dopant profile of a set of unmodified fins such that some fins of the set of modified fins (such as the edge fins) have a lower dopant concentration than corresponding fins in the set of unmodified fins.

In some embodiments, adjusting the doping characteristic includes regulating a type or a species of dopants in various fins of set of fins 160. In some embodiments, one or more fins in a subset of fins includes multiple types of dopants to regulate heat generation during operation of a semiconductor device. In certain embodiments, a doping characteristic of fins in a set of modified fins includes a bimodal distribution of dopant (i.e., at least two concentrations of the heat generation regulating dopant) across the set of modified fins. Some embodiments of semiconductor devices have more than two (i.e., at least three) concentrations of a dopant in the fins of the set of modified fins. A dopant concentration, in some embodiments, of sets of modified fins is higher at the center than at the edges. In some embodiments, set of fins 160 includes multiple dopant species. In some embodiments, a dopant profile for one dopant species in set of fins 160 is different from a dopant profile for another dopant species in set of fins 160.

Figure 2:
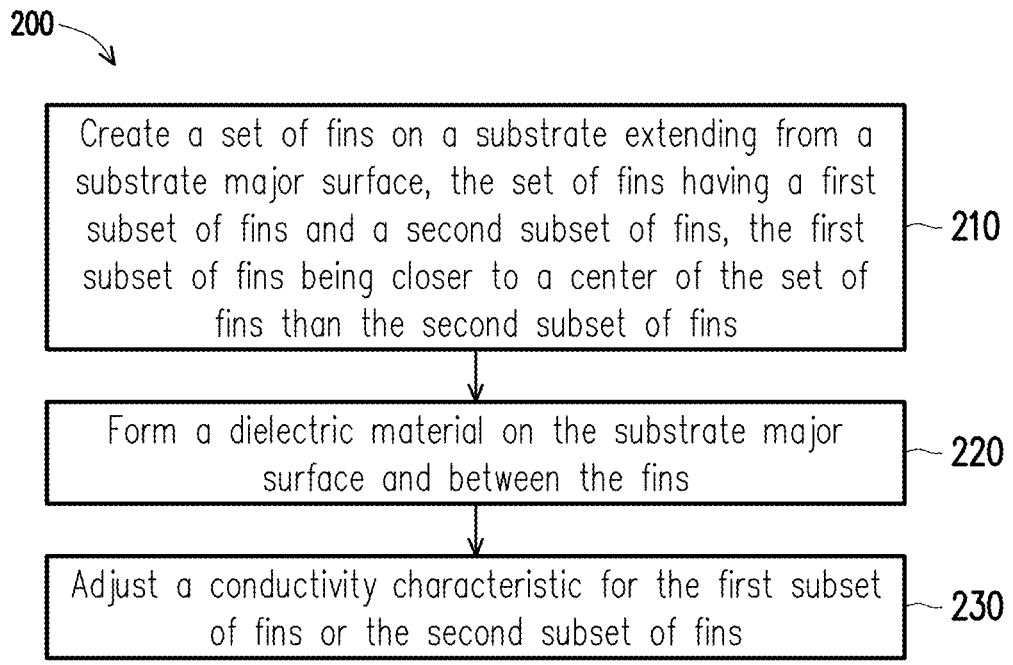
FIG. 2 is a flowchart of a method of modifying fins to adjust the heat generated by a set of fins, according to some embodiments.

FIG. 2 is a flowchart of a method 200 of modifying fins to adjust the heat generated by the set of fins of some embodiments of semiconductor devices. Heat generation is adjusted by modifying the resistance or threshold voltage of the individual fins in set of fins 160. In some embodiments, the adjusted heat generation profile is a centrally symmetric pattern of heat generation by the fins during operation in a semiconductor device. According to some embodiments, fins at a center of set of fins have a higher threshold voltage than fins at edges of set of fins. The higher threshold voltage results in smaller currents flowing through center fins, and consequently less heat generated during operation, in comparison with edge fins. According to some embodiments, center fins include fins 108, 110, 112, and 114 as portrayed in FIG. 1A. In some embodiments, edge fins include fins 104, 106, 116 and 118 of set of fins 160 as portrayed in FIG. 1A.

Method 200 includes an operation 210, where a set of fins is formed, extending from the substrate major surface of the substrate. The set of fins includes a first subset of fins located closer to a center of the set of fins; and a second subset of fins located closer to an edge of the set of fins. In some embodiments, the set of fins includes more than two subsets of fins.

In some embodiments, a fin semiconductor material is deposited onto or grown on the substrate. The fin semiconductor material is patterned and etched to form the fins on the substrate. In some embodiments, the fin semiconductor material is grown using an epitaxial process. In some embodiments, the fin semiconductor material is deposited using chemical vapor deposition CVD), plasma enhanced chemical vapor deposition (PE-CVD), or atomic layer epitaxy (ALE). In some embodiments, the fin semiconductor material is a same material as the substrate. In some embodiments, the fin semiconductor material is a different material from the substrate.

In some embodiments, the fins are formed by patterning the substrate and etching the substrate to define fins out of the substrate material, recessing the top surface of the substrate. According to some embodiments, a substrate major surface is the recessed substrate surface. According to some embodiments, the substrate is an N-doped substrate, doped with a dopant that contributes electrons as carriers to the device channel. According to some embodiments, the substrate is a P-doped substrate, doped with a dopant that contributes "holes" as carriers to the device channel. According to some embodiments, the substrate is a silicon-on-insulator (SOI) substrate or other type of electrically-isolating substrate designed to insulate a semiconductor device or arrays of semiconductor devices from other elements in different regions of an integrated circuit.

Method 200 includes an operation 220, in which a dielectric layer is formed by depositing a layer of dielectric material on the substrate major surface and between fins of the set of fins of the semiconductor device. According to some embodiments, the dielectric material is silicon dioxide, silicon oxy-nitride, a low-k dielectric material or another dielectric material configured to electrically insulate the fins from each other. A low-k dielectric material has a dielectric constant less than the dielectric constant of silicon dioxide. Some low-k dielectric materials contain voids or bubbles. Some low-k dielectric materials contain carbon. According to some embodiments, the dielectric material fills spaces between fins of set of fins. In some embodiments, dielectric material covers top sides of fins in set of fins. After deposition of the dielectric material, the dielectric material covers the set of fins completely in some embodiments. In some embodiments, depositing the dielectric material also includes recessing the dielectric material to partially expose the fins of the set of fins. In some embodiments, recessing the dielectric material includes an etching process. In some embodiments, recessing the dielectric material includes a planarization process followed by an etching process.

Method 200 includes an operation 230, in which a conductivity characteristic for the first subset of fins or a conductivity characteristic for the second subset of fins is adjusted according to embodiments of the present disclosure. In some embodiments, the conductivity characteristic of the first subset of fins and the conductivity characteristic of the second subset of fins are adjusted. According to some embodiments, adjusting the conductivity characteristic of fins in the first subset of fins or the second subset of fins involves adjusting a fin dimension. In some embodiments, adjusting the conductivity characteristic of fins in the first subset of fins or the second subset of fins involves adjusting a doping characteristic of the fins. In some embodiments, a doping characteristic is a dopant concentration. In some embodiments, a doping characteristic is a dopant type (i.e., P-type or N-type of dopant). In some embodiments, a doping characteristic is a number of dopants in fins of a semiconductor device. Following operation 230, the conductivity characteristic of the first subset of fins is different from the conductivity characteristic of the second subset of fins.

According to some embodiments, operation 220 is performed after operation 230. In some embodiments, the conductivity characteristic of either the first subset of fins or the second subset of fins is adjusted, then operation 220 is performed; then, the conductivity characteristic of the other of the first subset of fins or the second subset of fins is performed.

Figure 3:
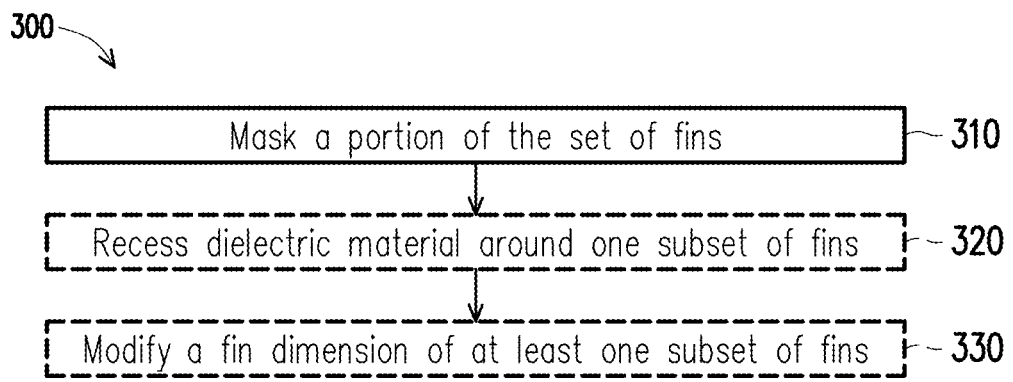
FIG. 3 is a flowchart of a method for adjusting conductivity of fins in a semiconductor device by adjusting a fin dimension, according to some embodiments.

FIG. 3 is a flowchart of a method 300 of adjusting conductivity characteristics of a semiconductor device by altering a fin dimension, according to embodiments of the present disclosure. In some embodiments, method 300 is a method of performing operation 230 of method 200 (FIG. 2).

Method 300 includes an operation 310 in which a portion of the set of fins is masked. In some embodiments, the first subset of fins is masked. In some embodiments, the second subset of fins is masked. In some embodiments which include more than two subsets of fins, multiple subsets of fins are masked. In some embodiments which include more than two subsets of fins, only one subset of fins is masked. In some embodiments, masking the portion of the set of fins includes depositing a photoresist material over the set of fins and patterning the photoresist material to expose at least one subset of fins. In some embodiments, masking the portion of the set of fins includes depositing a dielectric layer or hard mask layer over the set of fins and etching the dielectric layer or hard mask layer to expose at least one subset of fins.

Method 300 optionally includes an operation 320, in which the dielectric material deposited between fins of the set of fins, is recessed to increase an amount of fins of the first subset of fins or the second subset of fins exposed above the dielectric material. In some embodiments, recessing the dielectric material is performed simultaneously with operation 220 of method 200 (FIG. 2). According to some embodiments, recessing the dielectric material is performed in multiple recessing steps. In some embodiments, recessing the dielectric material is performed in a single recessing step. In some embodiments, recessing the dielectric material is performed using a dry etching or a wet etching process. In some embodiments which include more than two subsets of fins, recessing the dielectric material is performed on multiple subsets of fins. In some embodiments which include more than two subsets of fins, recessing the dielectric material is performed on a single subset of fins.

Recessing the dielectric material increases an amount of corresponding fins of the set of fins exposed above the dielectric material and therefore increases a size of the channel of those fins. Increasing the size of the channel reduces an amount of resistance in the channel and therefore reduces an amount of heat generated during operation of the semiconductor device.

In some embodiments, operation 320 is omitted. Operation 320 is omitted if a dimension of at least one fin is modified, in some embodiments. In some embodiments, operation 320 is omitted if a dopant characteristic of at least one fin is modified.

Method 300 optionally includes an operation 330, in which a fin dimension of fins in at least one subset of fins is altered. According to some embodiments, adjusting a fin dimension includes shortening fins of one set of fins, adjusting a top width of a fin, changing a shape of a portion of a fin above the dielectric material, or a combination thereof. In some embodiments, a fin dimension of both the first subset of fins and the second subset of fins is altered. In some embodiments which include more than two subsets of fins, a fin dimension of every subset of fins is altered. In some embodiments which include more than two subsets of fins, a fin dimension of multiple subsets of fins is altered. In some embodiments which include more than two subsets of fins, a fin dimension of a single subset of fins is altered. In some embodiments, a fin dimension of the first subset of fins is altered in a different manner from altering a fin dimension of the second subset of fins. For example, in some embodiments, a shape of the top portion of the first subset of fins is altered and a height of the second subset of fins is reduced.

In some embodiments, fins in the first subset of fins are modified by reducing total fin height by an etching or CMP process, while fins in the second subset of fins retain a total fin height equal to a starting fin height. In some embodiments, adjusting a fin dimension includes manufacturing steps including depositing a hardmask on a wafer surface, patterning the hardmask surface, opening the hardmask by a processing step such as plasma etching, and using CMP polishing to selectively remove material from beneath an opening in the hardmask. Using CMP polishing to reduce total fin height in the region of the hardmask opening modifies a fin dimension of some fins in the set of fins, altering the amount of current that travels through said fins and an amount of heat said fins generate in operation of a semiconductor device.

In some embodiments, a hardmask opening is formed above the first subset of fins closer to the edge of the set of fins. In some embodiments, the hardmask opening extends over the dielectric material between the fins of the first subset of fins and the second subset of fins at the center of the set of fins. According to some embodiments, a hardmask is removed after the etching or CMP process of the first subset of fins. According to some embodiments, modifying a fin dimension by shortening fins includes depositing a blanket mask layer such as silicon nitride or silicon oxynitride on the dielectric material, exposing top surfaces of the fins in the set of fins. The mask is then patterned to selectively expose the fins of one subset of fins in the set of fins. In some embodiments, the blanket hardmask layer is patterned corresponding to the patterning of the mask material and etched in order to expose the fins of the first subset of fins closer to the center of set of fins. According to some embodiments, modifying a fin dimension includes performing a second CMP step to reduce the height of fins in first subset of fins 164 (exposed by the opening in the hardmask) while the hardmask protects the fins of second subset of fins 162. In some embodiments, the chemistry and particle size distribution in the CMP slurry are tailored to be selective to the hardmask material while removing material from beneath the hardmask opening.

In some embodiments, modifying a fin dimension by shortening fins includes performing chemical etching or plasma etching of fins exposed by an opening in a hardmask in order to selectively remove fin material from first subset of fins 164. In some embodiments, the etching selectively removes upper portions of fin material while leaving the surrounding dielectric material intact. In some embodiments, the etching removes both fin material and dielectric material. In some embodiments, the etching removes fin material faster than dielectric material. In some embodiments, once the fins of the first subset of fins have a desired total height, the hardmask material is removed and the dielectric material recessed to a first thickness around and adjacent to each fin before continuing with fabrication of the FinFET. Recessing dielectric material 120 to a first thickness results in first subset of fins 164 with a first exposed fin height 140 and second subset of fins 162 with a second exposed fin height 440 (FIG. 4), where the first exposed fin height is smaller than the second exposed fin height.

According to some embodiments, modifying a fin dimension involves trimming upper portions of one subset of fins (exposed by an opening in a hardmask layer) while the other subset of fins is masked by a hardmask layer. Trimming the top ends of one subset of fins is performed, in some embodiments, by oxidizing an upper portion of each fin in the exposed subset of fins, and then performing an etch step to remove the oxidized fin material. Some embodiments include exposing the upper portions of one subset of fins of the set of fins and selectively oxidizing the supper portions of the fins in order to modify both a height and a width of the fins in the subset of fins.

In some embodiments, operation 330 is omitted. Operation 330 is omitted if the dielectric material is recessed to form a non-planar top surface of the dielectric material, in some embodiments. In some embodiments, operation 330 is omitted if a dopant characteristic of at least one fin is modified. In some embodiments, operation 330 is performed along with operation 320. In some embodiments, operation 330 is performed sequentially with operation 320. In some embodiments, at least a portion of operation 330 is performed simultaneously with a portion of operation 320. For example, in some embodiments, etching of an oxidized portion of a fin is performed simultaneously with recessing of the dielectric material.

Figure 4:
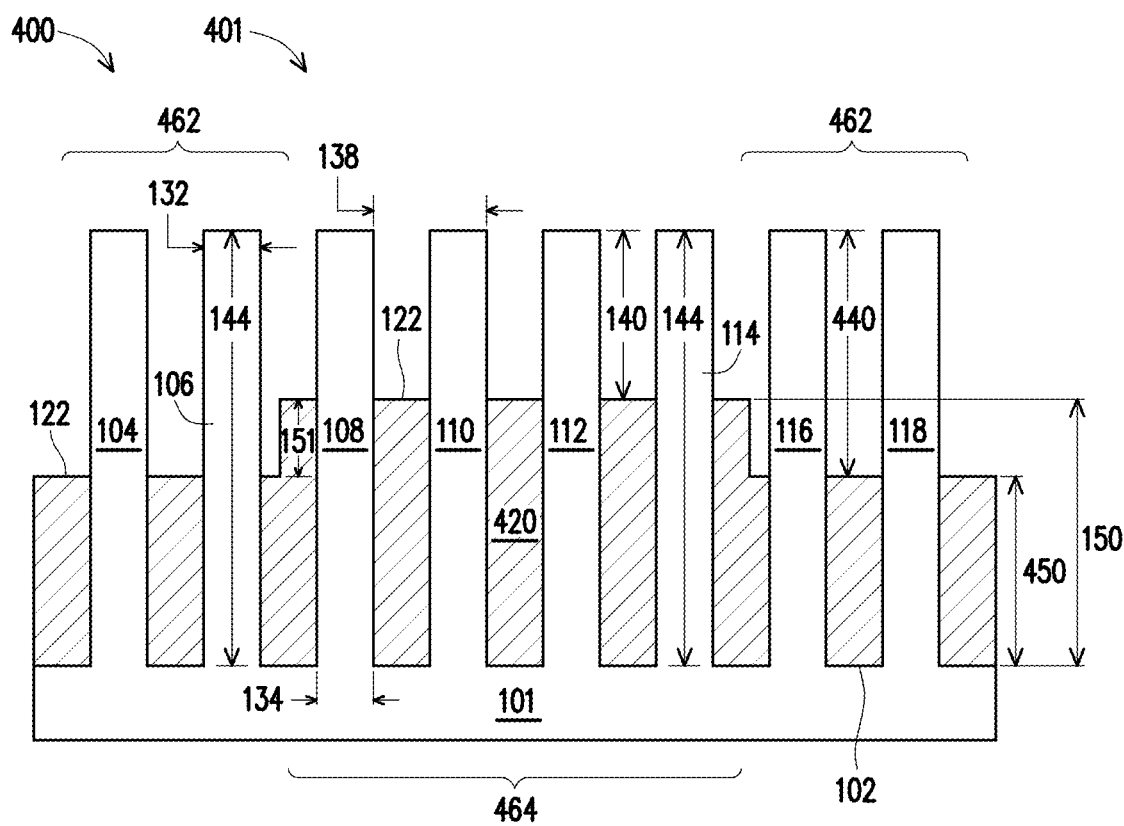
FIG. 4 is a cross-sectional view of a semiconductor device, according to some embodiments.

FIG. 4 is a cross-sectional view of a semiconductor device 400 according to some embodiments. In discussing FIG. 4 and other Figures described herein, reference numbers of semiconductor device 400 which match reference numbers of semiconductor device 100 or some other portrayed embodiment refer to the same element. Semiconductor device comprises a set of modified fins 401 which includes a first subset of fins 464 and a second subset of fins 462. In comparison with semiconductor device 100, a height of a dielectric material 420 is different at different positions in a set of modified fins 401. According to some embodiments, one subset of fins is modified in order to form set of modified fins 401. A substrate 101 with a substrate major surface 102 is a base for first subset of fins 464 and second subset of fins 462 on substrate major surface 102. Dielectric material 420 has a first thickness 150 next to and surrounding the fins of first subset of fins 464. Dielectric material 420 has a second thickness 450, smaller than first thickness 150, next to and surrounding the fins of second subset of fins 462. A step height 151 is a difference between first thickness 150 and second thickness 450. In some embodiments, step height 151 ranges from about 5 nanometers (nm) to about 45 nm. In some embodiments, step height 151 is greater than about 80% of first thickness 150. In some embodiments, step height 151 is about 80% to about 95% of first thickness 150. In some embodiments, step height 151 is less than about 10% of second thickness 450. In some embodiments, step height 151 ranges from about 5% to about 10% of second thickness 450. In some embodiments, set of modified fins 401 includes more than two subsets. In embodiments where step height 151 is too small in comparison with second thickness 450, the heat generation capacity of the center fins is likely to produce excess temperatures in the center of a set of fins, making the semiconductor device more prone to breakdown. Large step height corresponds to short center fins with reduced current-carrying capacity. In embodiments where step height 151 is too large in comparison with first thickness 150, the semiconductor device has a reduced ability to conduct current when the semiconductor device is switched on. In some embodiments, each subset of fins of set of modified fins 401 is surrounded by a different thickness of dielectric material 420. In some embodiments, at least one subset of fins of set of modified fins 401 is surrounded by a same height of dielectric material 420 as at least another subset of fins of set of modified fins 401.

Fins of first subset of fins 464 and second subset of fins 462 have starting fin height 144. In some embodiments, starting fin height is 100 nm. Fins of first subset of fins 464 have first exposed fin height 140 and fins of second subset of fins 462 have second exposed fin height 440. In some embodiments, second thickness 450 is around 50% of starting fin height 144. In some embodiments, first thickness 150 ranges from about 52% to about 97% of starting fin height 144. In some embodiments, first exposed fin height 140 ranges from about 5% to about 47% of starting fin height 144. When first exposed fin height 140 is too small, the capacity of a semiconductor device to carry sufficient current is hampered. When starting fin height 140 is nearly the same as, or greater than, second exposed fin height 440, the temperature differential between center and edge becomes large enough that semiconductor devices are subject to increased probability of failure. In some embodiments, second exposed fin height 440 ranges between 40% and 60% of starting fin height 144. In some embodiments, a ratio of second exposed fin height 440 to first exposed fin height 140 is between about 2:1 and about 10:1. When the height of center fins is between about 10% and about 50% the height of edge fins, semiconductor device temperature differentials are regulated to reduce premature device failure.

When the height of center fins is too large in comparison with edge fins, thermal regulation of semiconductor devices is insufficient to reduce premature device aging or failure. Fins of set of modified fins 401 have an initial top fin width 132 and a bottom fin width 134. In some embodiments, initial top fin width 132 and bottom fin width 134 are a same width. In some embodiments, initial top fin width 132 and bottom fin width 134 are different. Fins in the first subset of fins and the second subset of fins have a fin pitch 138 that is similar throughout set of modified fins 401.

Adjusting a fin dimension of fins at the center of set of modified fins 401 results in a more even temperature profile. Modified set of fins 401 includes fins that all have starting fin height 144, but a different dielectric material thicknesses surrounding the subsets of fins. Edge fins in second subset of fins 462 have a larger exposed fin height and larger exposed perimeter than center fins in first subset of fins 464 because the dielectric material has been recessed to a greater degree than for first subset of fins at the center of set of modified fins 401. When an exposed fin height is shorter, the fins have a smaller exposed perimeter than taller fins. Electrical current flowing through a transistor flows primarily at the interface between a channel region of a field effect transistor (FET) and a gate dielectric material that is against that channel region. Reducing the exposed perimeter of fins in first subset of fins 464 to be smaller than the exposed perimeter of fins in second subset of fins 462 results in the fins in first subset of fins 464 conducting less current and generating less heat than fins in second subset of fins 462. By reducing the amount of heat generated in the center of set of modified fins 401, the greater amount of heat generated by edge fins in second subset of fins is able to radiate laterally into surrounding materials or structures, resulting in a more uniform temperature profile than shown in FIG. 1B. Second subset of fins 462 in set of modified fins 401 differs from second subset of fins 162 in set of fins 160 by having a second exposed fin height 440 that is larger than second exposed fin height 140 of second subset of fins 162. Second exposed fin height 440 is larger than second exposed fin height 140 because dielectric material 120 is thinner than dielectric material 420 adjacent to fins in second subset of fins 462.

Figure 5:
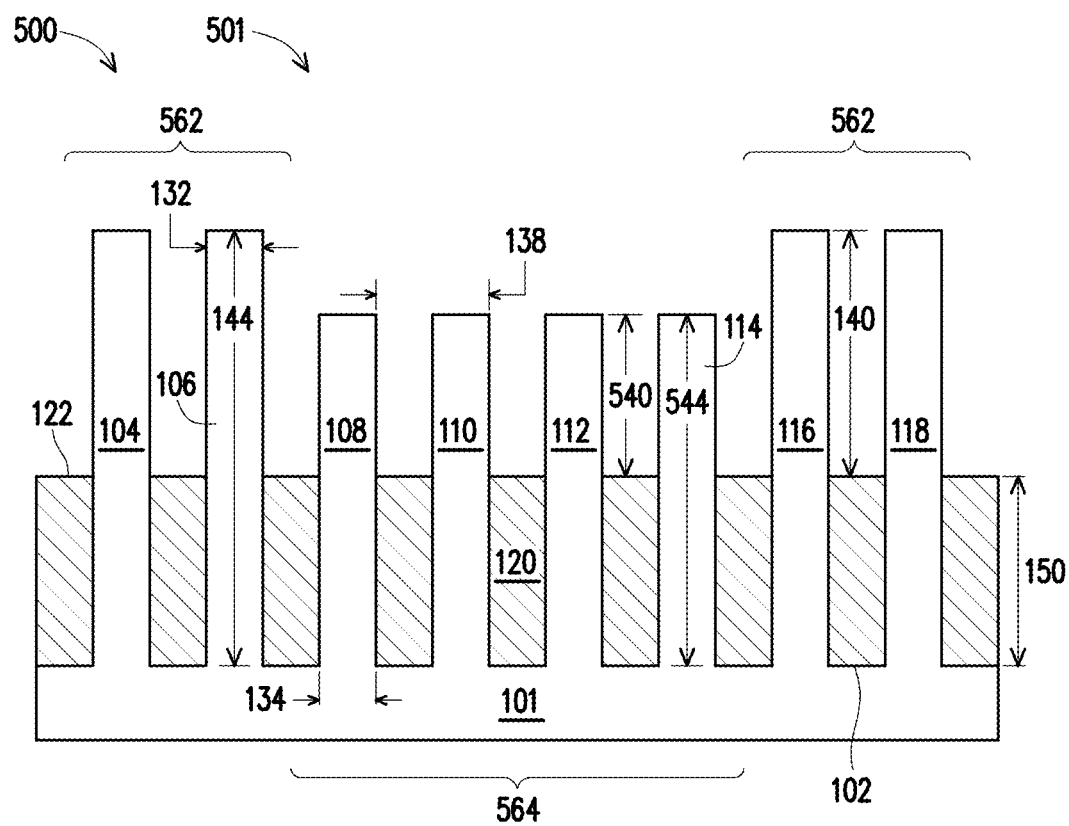
FIG. 5 is a cross-sectional view of a semiconductor device, according to some embodiments.

FIG. 5 is a cross-sectional view of a semiconductor device 500 according to some embodiments of the present disclosure. Semiconductor device 500 has a set of modified fins 501 on a substrate 101. Substrate 101 has substrate major surface 102 and is a base for set of modified fins 501. Set of modified fins 501 includes first subset of fins 564 at the center, and second subset of fins 562 at the edges of set of modified fins 501. The individual fins of the first subset of fins 164, fins 104, 106, 116, and 118, each have starting fin height 144 and also have first exposed fin height 140 above dielectric material top side 122. In some embodiments, starting fin height 144 is as much as 100 nm. In some embodiments, starting fin height 144 is less than 100 nm. Dielectric material 120 has a first thickness 150 that is substantially similar for all fins in second set of modified fins 501. In some embodiments, set of modified fins 501 includes more than two subsets. In some embodiments, each subset of fins of set of modified fins 501 has a different fin height or a different exposed fin height. In some embodiments, at least one subset of fins of set of modified fins 501 has a same fin height or exposed fin height as at least another subset of fins of set of modified fins 501.

The individual fins of second subset of fins 562, fins 108, 110, 112, and 114, each have total fin height 544, and have second exposed fin height 540 above dielectric material top side 122. The second exposed fin height 540 is between about 5% and about 95% of first exposed fin height 140. Fins of second subset of fins 562 that are shorter than about 5% of first exposed fin height 140 tend to reduce the current-carrying capacity of a semiconductor device below desirable levels, and fins that are taller than about 95% of first exposed fin height generate enough heat to cause premature device degradation. In some embodiments, second exposed fin height is between 40% and 60% of starting fin height 144 in order to preserve sufficient dielectric material between fins to reduce parasitic capacitance in semiconductor devices.

In some embodiments of semiconductor device 500, dielectric material 120 has a single thickness and fins have multiple exposed fin heights. Set of modified fins 501 has lower temperatures in the center in comparison with the set of fins 160 because the center fins 564 of the set of fins 501 have a smaller exposed fin height and smaller exposed perimeter than fins in the second subset of fins 562 at the edges of modified set of fins 501. Electrical current flowing through a transistor flows primarily at the interface between a channel region of a field effect transistor (FET) and a gate dielectric material that is against that channel region. Shorter fins, such as fins in first subset of fins 564, have a smaller exposed fin height and a smaller exposed perimeter than fins in second subset of fins 562. Electrical current flowing through a transistor flows primarily at the interface between a channel region of a field effect transistor (FET) and a gate dielectric material that is against that channel region. Fins with smaller exposed perimeter have a smaller interface between a channel region of the FET and a gate dielectric material, resulting in smaller capacity to flow current than larger fins with larger exposed perimeters. By reducing the amount of heat generated in the center of set of modified fins 501, the greater amount of heat generated by edge fins in second subset of fins is able to radiate laterally into surrounding materials or structures, resulting in a flatter temperature profile than shown in FIG. 1B.

According to some embodiments, fins at the edges of set of modified fins 501 resemble those of set of fins 160, while fins at the center of set of modified fins 501 (i.e., first subset of fins 564), have a shorter exposed fin height than fins in first subset of fins 164 of set of fins 160. According to some embodiments, while each fin in first subset of fins 164 has a smaller exposed perimeter, and consequently conduct less current and generating less heat, than a corresponding fin in first subset of fins 564, edge fins in second subset of fins 562 have a similar exposed fin height, conductive capacity, and heat generating capacity, as edge fins in second subset of fins 162 of set of fins 160. The heat-generating difference between center fins and edge fins in set of modified fins 501 results in a more uniform thermal profile than in set of fins 160.

Figure 6:
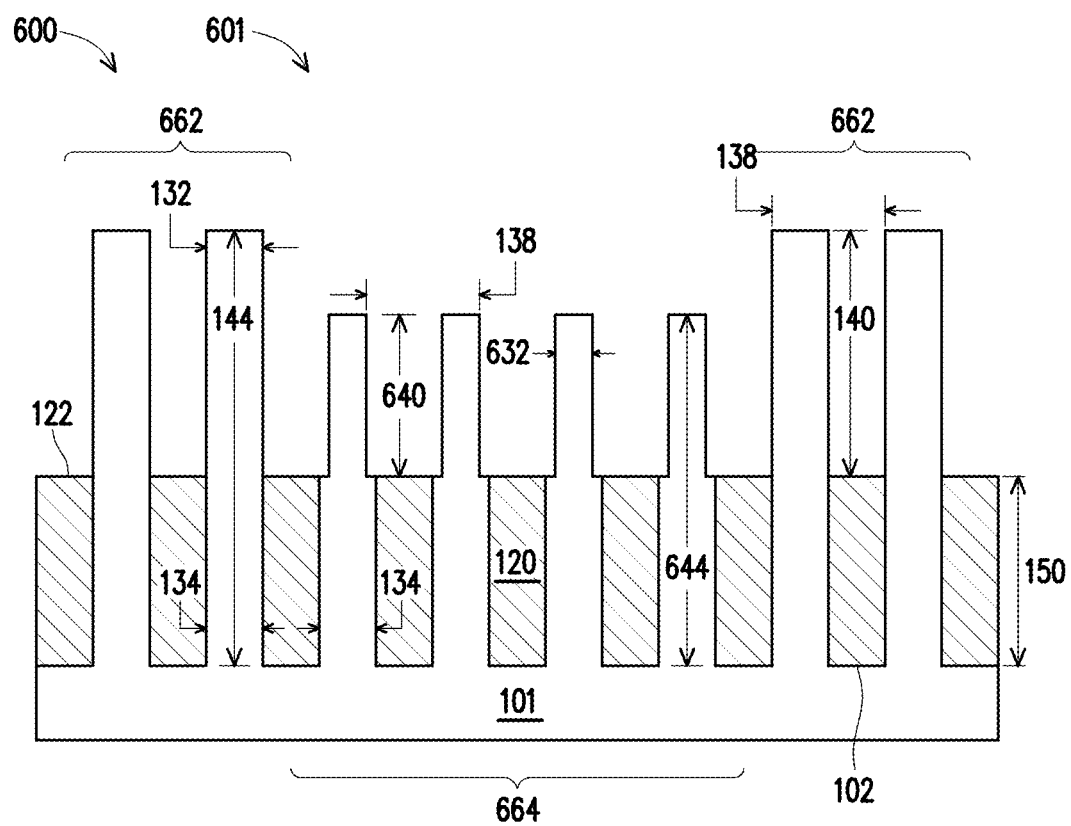
FIG. 6 is a cross-sectional view of a semiconductor device, according to some embodiments.

FIG. 6 is a cross-sectional view of a semiconductor device 600 according to some embodiments. Semiconductor device 600 includes a set of modified fins 601 having first subset of fins 664 and second subset of fins 662 that extend upward from substrate major surface 102 through dielectric material 120. Dielectric material 120 has first thickness 150 around each fin in set of modified fins 601.

The fins of first subset of fins 664 have a reduced fin height 644 and a reduced exposed fin height 640 above dielectric material top side 122. Fins of second subset of fins 662 have starting fin height 144, and have exposed fin height 140. Exposed fin height 140 is greater than reduced exposed fin height 640. According to some embodiments, a ratio of reduced fin height 640 and exposed fin height 140 ranges from about 11:20 to about 19:20. When the ratio of fin heights is too high, the semiconductor device performance degrades and the device exhibits greater leakage current, short channel effects, or parasitic capacitance. Fins in both first subset of fins 664 and second subset of fins 662 have bottom fin width 134. While in some embodiments, such as semiconductor device 500, each fin has a same initial top fin width 132, some embodiments have fins with different widths at a top end of the fins. Fins in first subset of fins 564 have a reduced top fin width 632 that is smaller than initial top fin width 132 of second subset of fins 662. In some embodiments, reduced top fin width 632 is between about 50% and about 95% of initial top fin width 132. Fins that are too narrow are subject to breakage during manufacturing processes, in some instances. Fins in first subset of fins and the second subset of fins have fin pitch 138. According to embodiments, fin pitch 138 of a subset of fins remains the same as measured from one side of a fin to corresponding side of an adjoining fin in the same subset of fins. In some embodiments, set of modified fins 601 includes more than two subsets. In some embodiments, each subset of fins of set of modified fins 601 has a different top fin width. In some embodiments, at least one subset of fins of set of modified fins 601 has a same top fin width as at least another subset of fins of set of modified fins 601. In some embodiments, every fin of set of modified fins 601 has starting fin height 144 and at least one subset of fins has a different top fin width from at least another subset of fins.

Fins in first subset of fins 664 of set of modified fins 601 conduct less electrical current and generate less heat than fins in second subset of fins 662 because electrical current flow in semiconductor devices occurs substantially at the interface between a channel region and a gate dielectric material against the channel region. By reducing the height and width of fins in first subset of fins 664 in set of modified fins 601 as compared to fins in second subset of fins 662, the center fins generate less heat than edge fins, altering the heat generation pattern of set of modified fins 601 as compared to a set of fins 160 that has not been modified. A set of modified fins 601 is designed to conduct a total amount of current comparable to a set of fins 160 that has not been modified, but the distribution of that electrical flow through fins in the semiconductor device is altered, resulting in a flatter, more uniform profile than is shown in FIG. 1B for set of fins 160. According to some embodiments, second subset of fins 662 of set of modified fins 601 and second subset of fins 162 of set of fins 160 have a similar exposed fin height, similar conductive capacity, and heat-generating capacity. The more uniform thermal profile results from the different heat-generating capacity of center and edge fins in set of modified fins 601.

Although fins portrayed in the present disclosure are frequently rectangular, other fin shapes are also compatible with semiconductor devices that regulate heat generation by subsets of fins in semiconductor devices. FIGS. 7A-7H are cross-sectional views of fin shapes according to one or more embodiments of the present disclosure. Other fin shapes include at least the shapes described as follows. Some embodiments of fins include a trapezoidal top as portrayed in FIG. 7A, element 710, where both the base and the top of the fin are narrower than a portion of the fin embedded in dielectric material, and the top of the fin is narrower than the base of the fin above the dielectric material where the trapezoid shape begins. Some embodiments of fins include a pyramid or triangle shape 720 as portrayed in FIG. 7B, where the pyramid or triangle shape is tapered from a level of the fin to a tip of the fin and the fin top is pointed. Some embodiments of fins include an inverted trapezoid 730 as portrayed in FIG. 7C, where the top of the fin has a width greater than an undercut region of the fin beneath the fin top, the undercut region ending at a height above the substrate where the fin undercut region is roughly co-planar with a dielectric material.

Figure 7A:
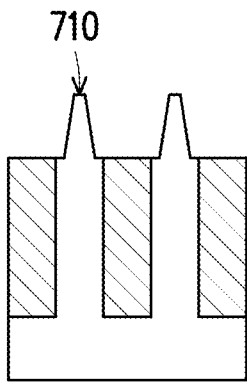
FIGS. 7A-7H are cross-sectional views of semiconductor devices having different fin profiles in accordance with some embodiments.
Figure 7B:
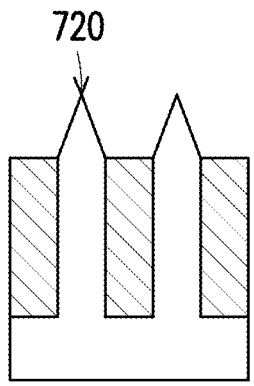
Figure 7C:
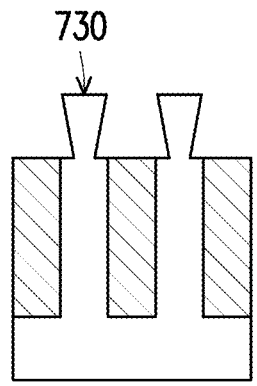
Figure 7D:
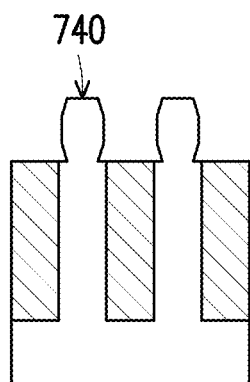
Figure 7E:
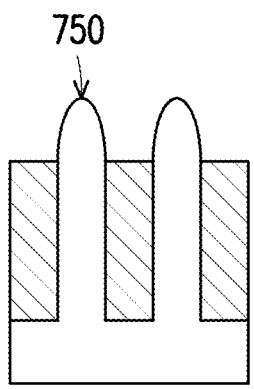
Figure 7F:
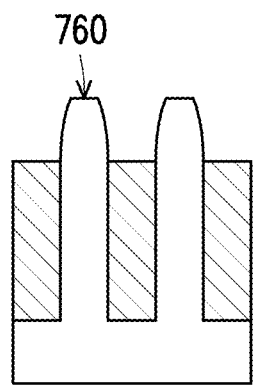
Figure 7G:
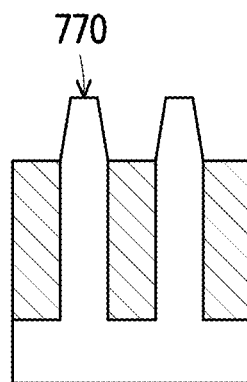
Figure 7H:
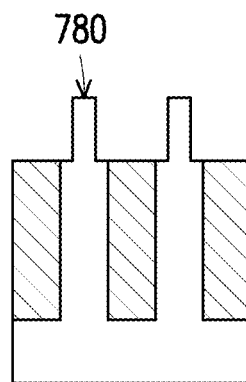

Some embodiments of the fin include a polygonal fin shape 740, such as a hexagon, as portrayed in FIG. 7D, where the fin is faceted. In some embodiments, multiple facets are parallel. In some embodiments, no facets are parallel. Some embodiments of fins include rounded fins, as portrayed in FIG. 7E, element 750, where an exposed portion of fin above a masking dielectric fill material between fins is rounded from a nearly-vertical sidewall on one side of the fin, around the top side of the fin, and tapers back to a nearly-vertical sidewall on the other side of the fin. Some possible fin shapes include rounded fins with truncated tops as portrayed in FIG. 7F, element 760, in which fins have the rounded shape of FIG. 7E, element 750, but having a flattened, truncated top portion. Some fin shapes include trapezoids as shown in FIG. 7G, element 770, where the base of the trapezoid has a width equal to that of fin beneath the dielectric material, the opposing sides of the fin taper in a linear manner up to a flat top side approximately parallel to a surface of a substrate beneath the fins. Some fin shapes include a reduced rectangle shape 780, as shown in FIG. 7H, where the sides and top are straight or linear and perpendicular to each other, the width of the upper portion remaining approximately constant and being smaller than a width of a lower portion of the fin.

Sets of fins have different fin shape profiles according to the amount of exposed perimeter of fins in subsets of fins. According to some embodiments, a set of modified fins has a non-rectangular fin profile similar to one of the fin profiles shown in FIGS. 7A-7H. A subset of fins that is modified to have a smaller exposed fin perimeter is more susceptible to exposed perimeter change for some fin profiles than for other fin profiles. Selecting a fin profile allows a manufacturer to adjust a ratio of exposed perimeter in different subsets of fins after a fin dimension alteration step, according to embodiments. Thus, fins in the first subset of fins have, according to some embodiments, a different fin profile than fins in the second subset of fins according to an initial fin profile and a selected method of performing a fin dimension adjustment.

Figure 8:
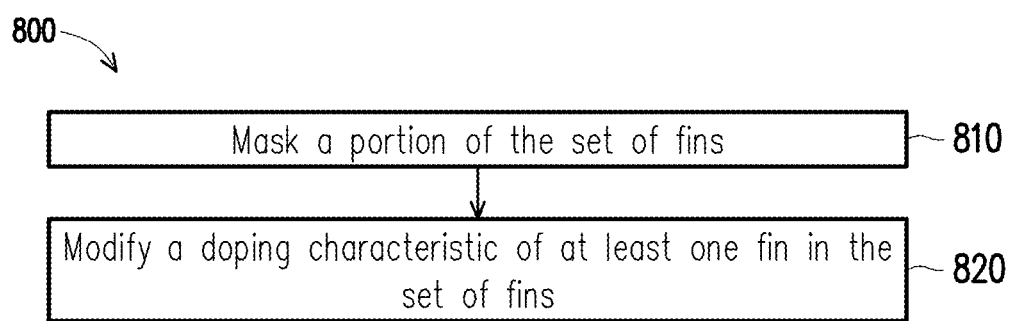
FIG. 8 is a flowchart of a method for adjusting conductivity of fins in a semiconductor device by adjusting a doping characteristic, in accordance with some embodiments.

FIG. 8 is a flowchart of a method 800 for adjusting conductivity of fins of a semiconductor device by adjusting a doping characteristic in accordance with some embodiments. In some embodiments, method 800 is a method of performing operation 230 of method 200 (FIG. 2).

Method 800 includes an operation 810 in which a portion of the set of fins is masked. In some embodiments, the first subset of fins is masked. In some embodiments, the second subset of fins is masked. In some embodiments which include more than two subsets of fins, multiple subsets of fins are masked. In some embodiments which include more than two subsets of fins, only one subset of fins is masked.

In some embodiments, masking the portion of the set of fins includes depositing a photoresist material over the set of fins and patterning the photoresist material to expose at least one subset of fins. In some embodiments, masking the portion of the set of fins includes depositing a dielectric layer or hard mask layer over the set of fins and etching the dielectric layer or hard mask layer to expose at least one subset of fins.

Method 800 also includes an operation 820 in which a doping characteristic of at least one fin of the set of fins is modified. Modifying doping characteristics of fins in a semiconductor device regulates the resistance or the threshold voltage of the fins. Fins having different threshold voltages or different resistances in different subsets of fins generate different amounts of heat in the fins of each subset of fins. Fins having greater amounts of heat produced at the edge, as compared to the center help to define a uniform temperature profile across the set of fins and lower risk of age-related breakdown such as HCI, TDDB, or BTI than sets of fins that have uniform conductivity characteristics and uneven temperature profiles.

In some embodiments, a doping characteristic is modified by increasing the concentration of a dopant in at least one subset of fins of the set of fins. In some embodiments, a doping profile of the set of fins is bimodal, where one subset of fins has a different dopant characteristic from another subset of fins. In some embodiments, all fins are processed to receive a dopant and at least one subset of fins is subjected to an additional doping process for heat-generation regulating purposes. In some instances, the method includes adding a dopant to each fin in the set of fins, where fins in the center have a larger concentration of dopant than fins at the edges. In some embodiments, fins in the second subset of fins have a larger amount of dopant than fins in first subset of fins.

In some embodiments, operation 820 results in a dopant profile that is bimodal. In some embodiments, operation 820 results in a dopant profile that includes more than two different doping levels. In some embodiments, operation 820 results in a dopant profile where each fin of the set of fins has a different dopant concentration than every other fin of the set of fins.

In some embodiments, operation 820 includes an angled implantation process. In some embodiments, operation 820 includes a vertical implantation process. In some embodiments, operation 820 includes a single implantation process. In some embodiments, operation 820 includes multiple implantation processes. In some embodiments, the dopants for sequential implantation processes are the same dopant species. In some embodiments, the dopants for sequential implantation processes are different dopant species.

In some embodiments, operation 820 includes depositing a layer of dopants and annealing the semiconductor device to drive the dopants into corresponding fins of the set of fins. In some embodiments, operation 820 includes cyclically depositing a layer of dopants and annealing the semiconductor device. In some embodiments, dopants of the layer of dopants for sequential cycles are a same dopant species. In some embodiments, dopants of the layer of dopants for sequential cycles are different dopant species.

In some embodiments, method 800 is combined with method 300 (FIG. 3) in order to complete operation 230 of method 200 (FIG. 2).

Figure 9A:
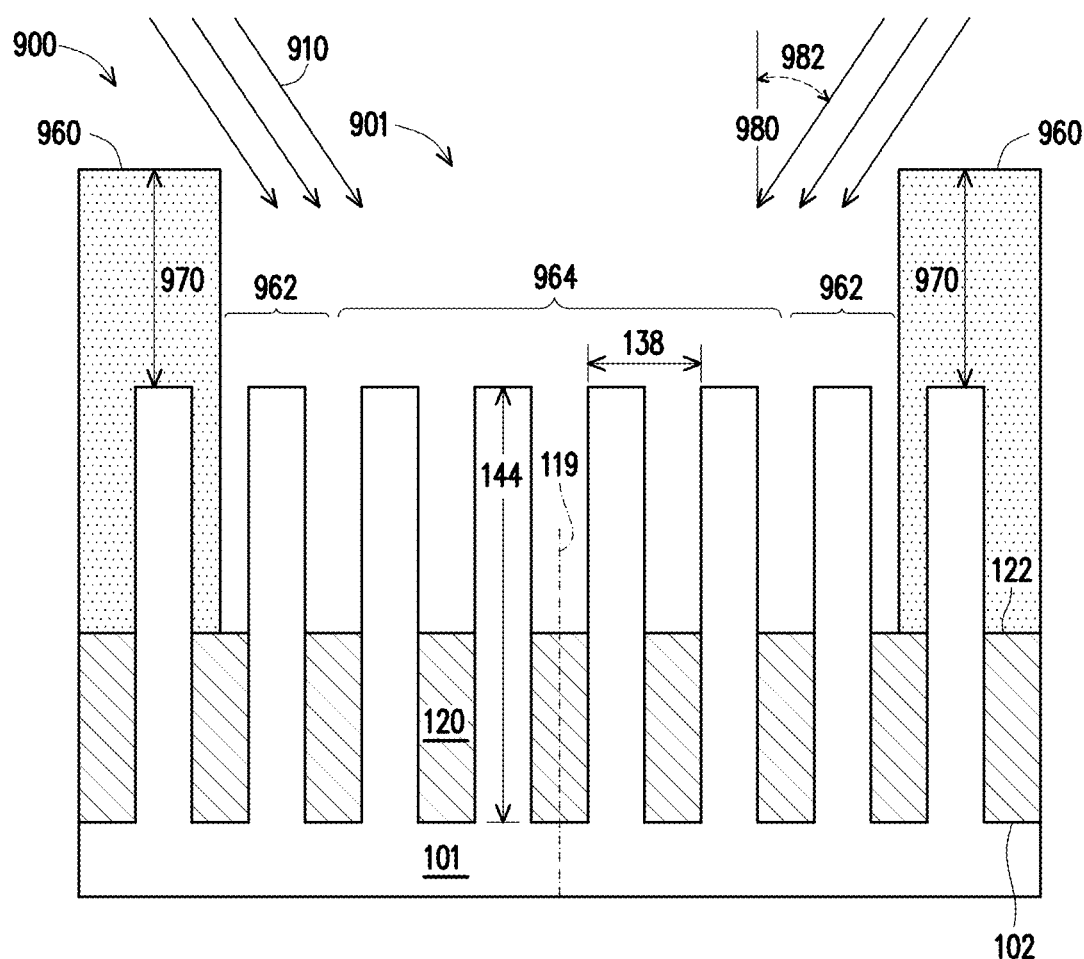
FIG. 9A is a cross-sectional view of a semiconductor device during a manufacturing process, in accordance with some embodiments.

FIG. 9A is a cross-sectional profile of a semiconductor device 900 during operation 820 in accordance with some embodiments of the present disclosure. Semiconductor device 900 contains a set of modified fins 901 implanted with a dopant by angled implantation 910. The substrate 101 has a substrate major surface 102 layered with a dielectric material 120. The dielectric material 120 has a dielectric material top side 122 through which set of modified fins 901 protrudes. Set of modified fins 901 has first subset of fins 964 located at the center 119 of an opening in a photoresist mask 960 and second subset of fins 962 located adjacent to the photoresist mask 960. Fins of first subset of fins 964 and second subset of fins 962 have starting fin height 144. The photoresist mask 960 has a mask height 970 measured from the top most side of a fin in set of modified fins 901 to a top side of the photoresist mask 960. In certain embodiments, dummy fins are located under photoresist mask 960 and are protected from angled implantation 910 by photoresist mask 960. Dummy fins may be present in many embodiments in order to assist in forming uniform fin shapes and profiles of fins of semiconductor devices. According to some embodiments, some dopant atoms penetrate through the photoresist mask 960 into dummy fins, second subset of fins 962, and first subset of fins 964. Dummy fins receive a smallest amount of dopant from an implanting process, second subset of fins 962 receives a larger amount of dopant from an implanting process, and first subset of fins 164 receives a largest portion of dopant atoms from an implanting process. Fins have a fin pitch 138. In some embodiments, dopant atoms are implanted at an implantation angle 982, measured at an angle offset from a line 980 normal to the substrate major surface 102. Implantation angle 982 is greater than 5 degrees and smaller than 75 degrees, according to some embodiments.

In some embodiments, angled implantation 910 is performed more than once. In some embodiments, photoresist mask 960 covers second subset of fins 962 during a first angled implantation 910; and photoresist mask 960 exposes second set of fins 962 during a second angled implantation 910. Implantation angle 982 is selected according to reflection and penetration characteristics of dopant atoms in order to achieve a desired dopant profile in set of angular-implantation fins 901. In some embodiments, implantation angle 982 is a large implantation angle because a greater amount of photoresist mask is desirable in order to achieve a smaller dopant atom concentration at the edge in second subset of fins 962. Implantation angle 982 may be larger if dopant atoms have a greater tendency to penetrate photoresist mask 960, or smaller if dopant atoms have a lesser tendency to penetrate photoresist mask 960. When implantation angle is too small, an insufficiently small difference in dopant concentration between center fins and edge fins of first subset of fins 964 and second subset of fins 962 will lead to excessive heat generation by fins in first subset of fins 964. According to some embodiments, the height of photoresist mask is adjusted to provide increased shielding of fins at the edge of the set of fins. Selecting a height of photoresist mask 960 is a function of implant angle, fin pitch 138 of the fins in set of fins 160, desired dopant profile and the penetration characteristics of a dopant atom being implanted into the set of fins.

Figure 9B:
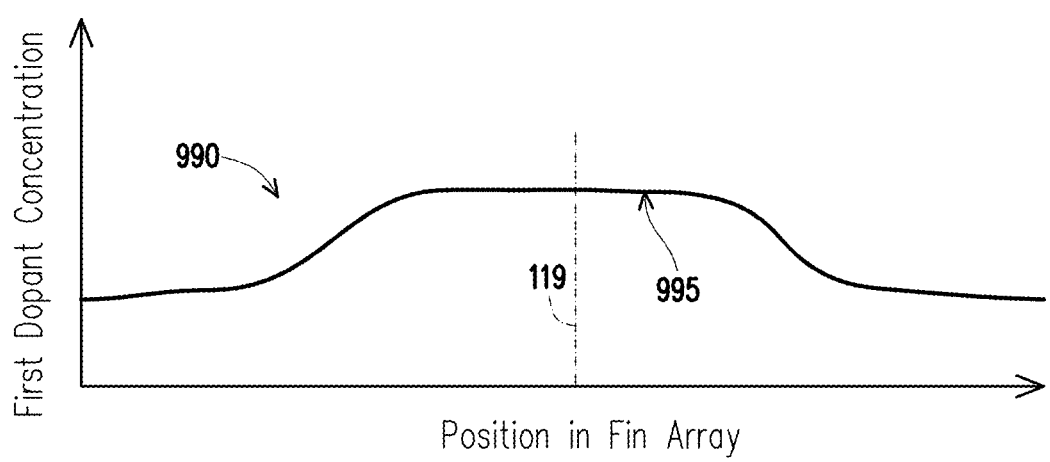
FIG. 9B is a chart of dopant concentration in some embodiments of the present disclosure.

FIG. 9B is a chart 990 with a dopant concentration plot 995 having a concentration profile of a dopant at positions corresponding to fin positions in semiconductor device 900 of FIG. 9A, according to some embodiments. Dopant concentration plot 995 indicates that a concentration of a dopant is higher in first subset of fins 964 than in second subset of fins 962 in some embodiments. Further, a dummy fin dopant concentration in dummy fins covered by photoresist mask 960 is smaller than a dopant concentration in second subset of fins 962 in some embodiments of the present disclosure.

Figure 10A:
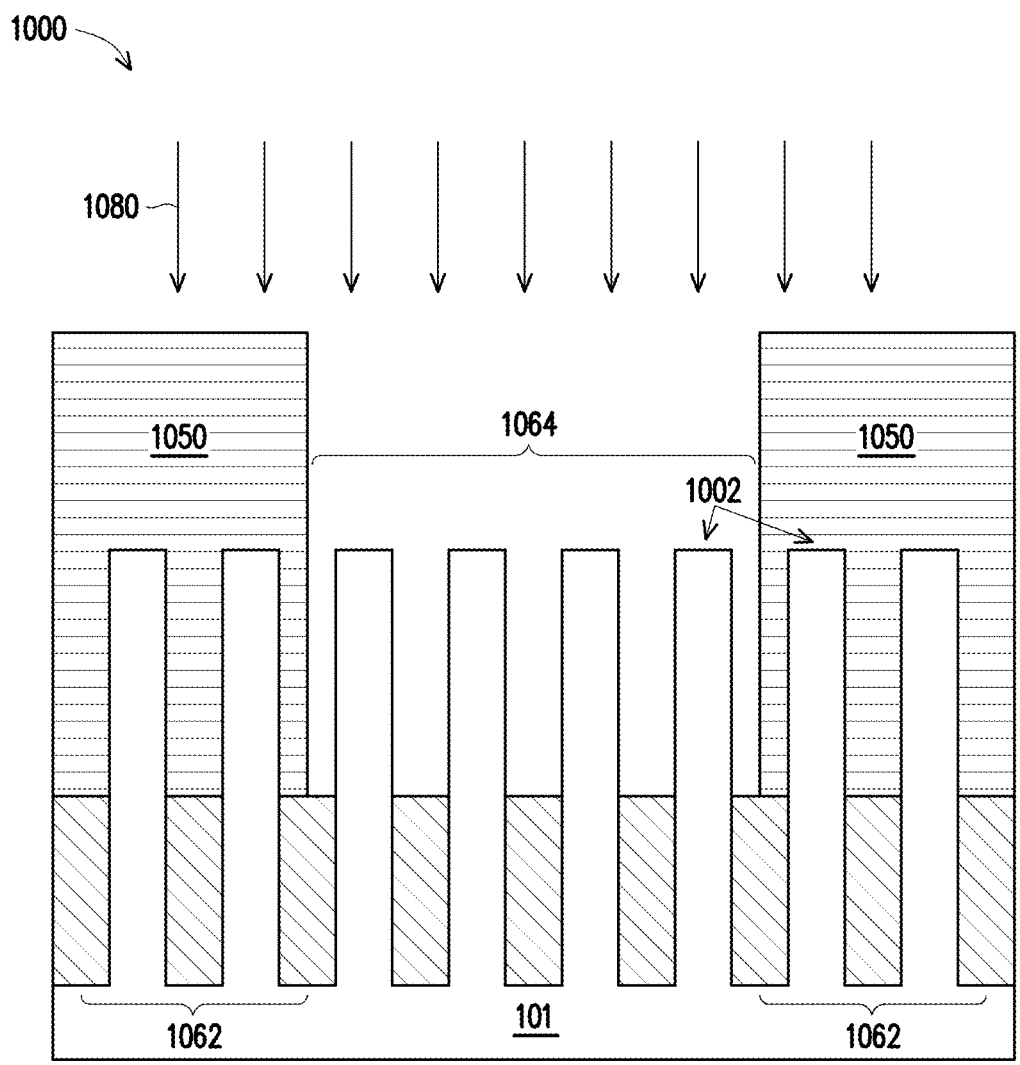
FIGS. 10A and 10B are cross-sectional views of a semiconductor device during various stages of a manufacturing process, according to some embodiments.
Figure 10B:
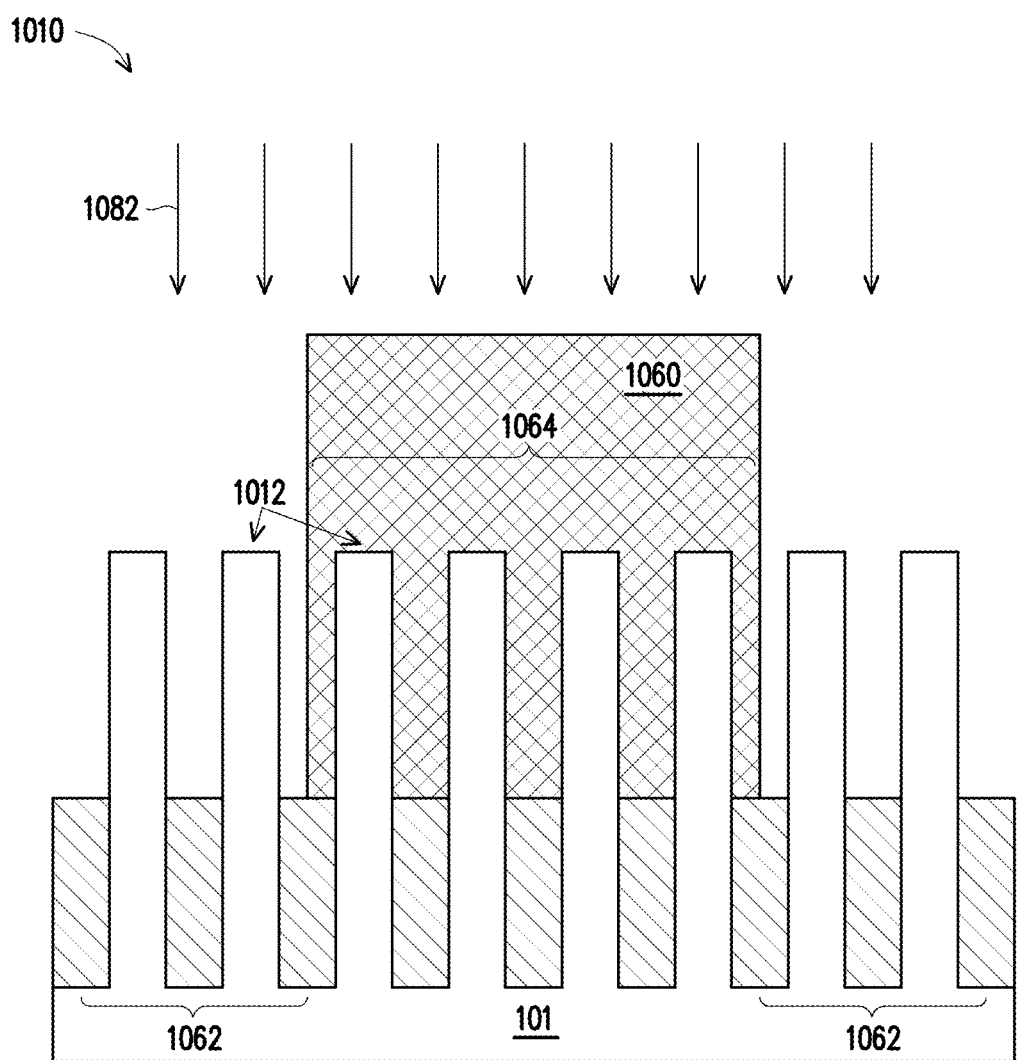
Figure 10C:
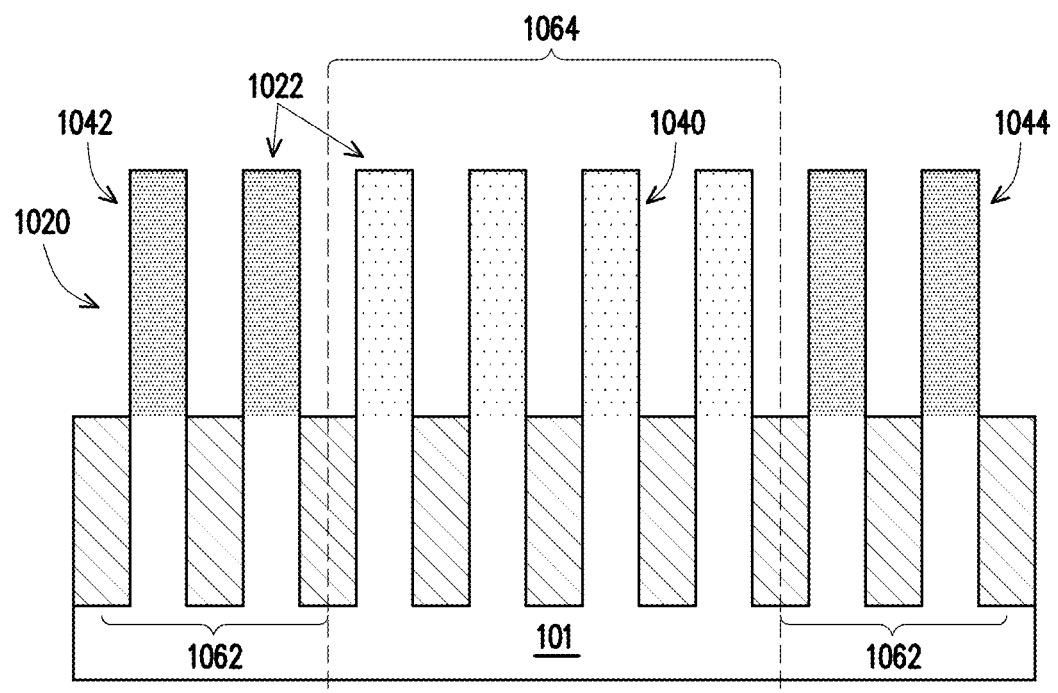
FIG. 10C is a cross-sectional view of a semiconductor device, according to some embodiments.

FIGS. 10A, 10B, and 10C are cross-sectional views of a semiconductor device at various stages of operation 820 in accordance with some embodiments. FIGS. 10A-10C include a set of bimodal dopant profile modified fins. In some embodiments, set of bimodal dopant profile modified fins 1022 has multiple dopants species added into one subset of fins (such as second subset of fins 1062), while the other subset of fins (such as first subset of fins 1064) has a single dopant type. In some embodiments of set of bimodal dopant profile modified fins 1022, one subset of fins (such as second subset of fins 1062) has one dopant type (N-type or P-type) and the other subset of fins (such as first subset of fins 1064) has the other type of dopant (P-type or N-type).

In some embodiments, first subset of fins 1064 has a first type of doping characteristic (either a different dopant concentration or single dopant type) whereas second subset of fins 1062 has a second type of doping characteristic (such as a lower concentration of a first type of dopant or containing multiple types of dopants). According to some embodiments, semiconductor devices having an N-type dopant such as boron as the primary type of fin dopant in the center fins (N-FETS, or NFETS), have a P-type dopant such as arsenic as a secondary type or opposite type of dopant in the edge fins. These opposite types of dopants are added to create a bimodal different distribution within the set of fins, resulting in greater current flow through fins at the edge of the set of fins in the FinFET. According to some embodiments, the dopant pattern described above is reversed, where P-type dopant is added to center fins and N-type dopants are added to edge fins, in order to achieve a bimodal distribution of dopants. Implanting different dopant types into a same fin impacts a number of charge carriers with the fin. As a result the conductivity of the fin is altered. In some embodiments, semiconductor device 1000 includes more than two subsets of fins. In some embodiments, at least one subset of fins includes multiple dopant types while another subset of fins includes a single dopant type. In some embodiments, a number of charge carriers in each subset of fins is different from a number of charge carriers in every other subset of fins.

FIG. 10A is a cross sectional view of a semiconductor device 1000 during operation 820 in accordance with some embodiments. Semiconductor device 1000 includes set of modified fins 1002 comprising first subset of fins 1064 and second subset of fins 1062 located on substrate 101 and extending through a dielectric material. The second subset of fins 1062 is covered and masked by a first mask layer 1050 during first doping step 1080 of a first species of dopant is implanted into first subset of fins 1064 at a first implantation concentration. In some embodiments, the doping process includes depositing a layer of dopants on first subset of fins 1064 and annealing semiconductor device 1000.

FIG. 10B is a cross sectional view of a semiconductor device 1010 during operation 820 in accordance with some embodiments. Semiconductor device 1010 includes set of modified fins 1012. Set of modified fins 1012 includes a first subset of fins 1064 that is masked by a second mask layer 1060 such as a photoresist layer or spin on organic layer, while the second subset of fins 1062 undergoes a second doping step 1082 of a second species of dopant at a second implantation concentration. In some embodiments, the first dopant species is the same as the second dopant species. In some embodiments, the first dopant species is different from the second dopant species. In some embodiments, the first implantation concentration is the same as the second implantation concentration. In some embodiments, the first implantation concentration is different from the second implantation concentration. In some embodiments, the doping process includes depositing a layer of dopants on second set of fins 1062 and annealing semiconductor device 1000.

In some embodiments, first doping step 1080 portrayed in FIG. 10A is performed before second doping step 1082 portrayed in FIG. 10B. In some embodiments, first doping step 1080 performed in FIG. 10A is performed after second doping step 1082 portrayed in FIG. 10B. According to some embodiments, first doping step 1080 and second dopant step 1082 are independently performed at an implantation angle between 0° and 5°. According to some embodiments, first doping step 1080 and second doping step 1082 involve the addition of more than one type of dopant at a time. According to some embodiments, when more than one type of dopant is added to an exposed set of fins in either first subset of fins 164 or second subset of fins 162, the dopants may be of opposite types (N-type and P-type).

FIG. 10C is a cross-sectional profile of some embodiments of a set of modified fins 1022 that have undergone both first doping step 1080 and second doping step 1082, resulting in a set of modified fins that has, in three different regions of set of modified fins 1022, two different dopant characteristics. First region 1040 of set of modified fins 1020 has a first dopant characteristic. First region 1040 corresponds, according to some embodiments, to first subset of fins 1064. In some embodiments, second subset of fins 1062 has second region 1042 and third region 1044 with a second dopant characteristic. In some embodiments, second region 1042 and third 1044 are separated by first region 1040. Dopant characteristics are created by combining one or more dopant profiles of FIG. 10D.

Figure 10D:
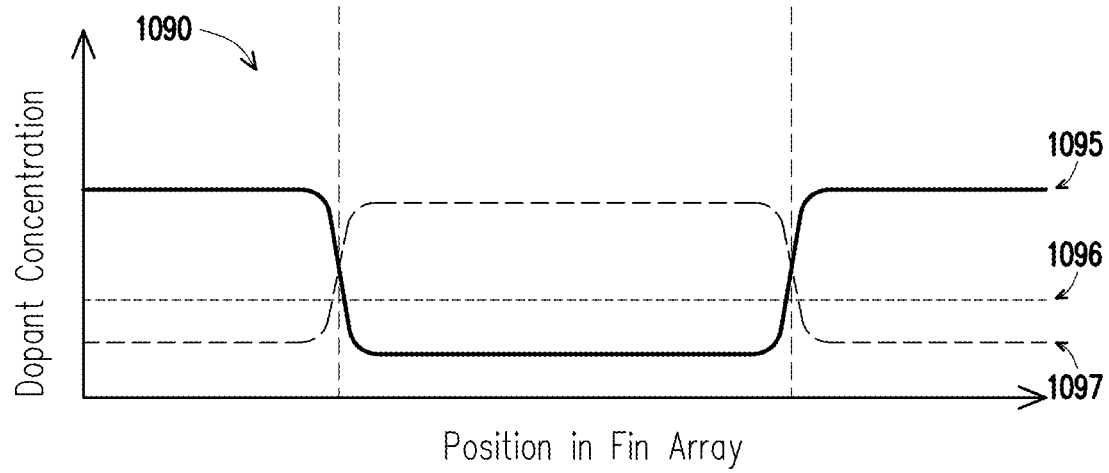
FIG. 10D is a graph of a dopant concentration profile for a set of fins, according to some embodiments.

FIG. 10D is a chart 1090 of dopant profiles present in some embodiments of set of modified fins 1022. In some embodiments, first region 1040 has a smaller concentration of a dopant than second region 1042 and 1044, consistent with first doping profile 1095. First doping profile 1095 is a plot of a doping profile consistent with addition of a dopant to second subset of fins 162 by second doping step 1082.

In some embodiments, first region 1040, second region 1042 and third region 1044 have a same concentration of a dopant, consistent with second doping profile 1096. In some embodiments, a dopant is added to a set of fins with no mask present, resulting in second doping profile 1096. According to some embodiments, first region 1040 has a larger concentration of a dopant than second region 1042 and 1044, consistent with third doping profile 1097. Third doping profile 1097 is consistent with addition of a dopant to first subset of fins 1064 during first doping step 1080. In some embodiments, a dopant is added to first subset of fins 1064 and second subset of fins 1062 in a same doping step, resulting in second doping profile 1096. According to some embodiments, final doping profiles of one or more dopants are formed in set of modified fins 1022 by combining first doping step 1080, second doping step 1082, and/or a doping step that adds a dopant to subset of fins 1064 and second subset of fins 1062 in a same doping step, in order to achieve a target doping profile in set of modified fins 1022.

According to embodiments of the present disclosure, some sets of fins contain one subset of fins that is modified to adjust an amount of heat generated by fins. In some embodiments, two or more subsets of fins are modified in order to adjust an amount of heat generated by fins in a set of fins. According to some embodiments, one subset of fins is modified by adjusting an exposed fin height of the fins in the subset of fins. In some embodiments, adjusting the exposed fin height is performed by, while all fins retain a starting fin height, recessing a dielectric material surrounding the fins to a different thickness around one subset of fins than the thickness of dielectric material surrounding the other subset of fins. In some embodiments, adjusting an exposed fin height is accomplished by recessing fins (such as by a chemical mechanical polishing (CMP) step) of one subset of fins while the fins of the other subset of fins retain a starting fin height. According to some embodiments, modifying a subset of fins includes modifying a top fin width or a fin shape of one subset of fins. In some embodiments, modifying a subset of fins includes adjusting a dopant concentration of the subset of fins while fins in another subset of fins has an unmodified dopant concentration. According to some embodiments, modifying a subset of fins includes adjusting one or more of: a fin exposed height, a top fin width, or a dopant concentration of the subset of fins.

An aspect of this description relates to a method of making a semiconductor device. The method includes defining a first fin structure over a major surface of a substrate, wherein the first fin comprises a first material. The method further includes defining a second fin structure over the major surface of the substrate. Defining the second fin structure includes forming a lower portion of the second fin structure, closest to the substrate, having the first material, and forming an upper portion of the second fin structure, farthest from the substrate, having a second material different from the first material. The method further includes forming a dielectric material over the substrate and between the first fin structure and the second fin structure. The method further includes removing the upper portion of the second fin structure, wherein removing the upper portion of the second fin structure comprises reducing a height of the second fin structure to be less than a height of the first fin structure. In some embodiments, defining the first fin includes defining the first fin comprising the first material different from a material of the substrate. In some embodiments, forming the dielectric material includes forming the dielectric material surrounding the lower portion of the second fin structure. In some embodiments, forming the dielectric material includes forming the dielectric material having a constant thickness. In some embodiments, defining the first fin structure includes epitaxially growing the first fin structure. In some embodiments, removing the upper portion of the second fin structure comprises performing an etching process. In some embodiments, removing the upper portion of the second fin structure includes removing an entirety of the upper portion of the second fin structure, and the upper portion of the second fin structure directly contacts the lower portion of the second fin structure. In some embodiments, the method further includes forming a gate structure on the first fin structure. In some embodiments, the method further includes forming a gate structure on the second fin structure. In some embodiments, removing the upper portion of the second fin structure includes exposing a top surface of the lower portion above a top-most surface of the dielectric material.

An aspect of this description relates to a method of making a semiconductor device. The method includes defining a first fin structure over a major surface of a substrate, wherein the first fin comprises a first material, and the first fin structure has a first height. The method further includes defining a second fin structure over the major surface of the substrate, wherein the second fin structure has the first height. Defining the second fin structure includes forming a lower portion of the second fin structure, closest to the substrate, having the first material, and forming an upper portion of the second fin structure, farthest from the substrate, having a second material different from the first material. The method further includes forming a dielectric material over the substrate and partially surrounding the first fin structure and the second fin structure. The method further includes removing the upper portion of the second fin structure. In some embodiments, removing the upper portion of the second fin structure includes reducing a height of the second fin structure to a second height less than the first height. In some embodiments, forming the dielectric material includes forming the dielectric material having a constant thickness between the first fin structure and the second fin structure. In some embodiments, removing the upper portion of the second fin structure includes exposing a top surface of the lower portion of the fin structure above a top-most surface of the dielectric material. In some embodiments, defining the first fin structure includes defining the first fin structure having the first material different from a material of the substrate. In some embodiments, forming the upper portion of the second fin structure includes forming the upper portion having the second material including silicon. In some embodiments, the method further includes forming a gate structure over at least one of the first fin structure or the second fin structure. In some embodiments, removing the upper portion of the second fin structure includes a selective etching process.

An aspect of this description relates to a method of making a semiconductor device. The method includes growing a first fin structure over a substrate, wherein the first fin comprises a first material, and the first fin structure has a first height. The method further includes defining a second fin structure over the major surface of the substrate, wherein the second fin structure has the first height. Defining the second fin structure includes growing a lower portion of the second fin structure, closest to the substrate, having the first material, and forming an upper portion of the second fin structure, farthest from the substrate, having a second material different from the first material. The method further includes depositing a dielectric material over the substrate and between the first fin structure and the second fin structure. The method further includes removing the upper portion of the second fin structure to expose a top surface of the lower portion above a top-most surface of the dielectric material. In some embodiments, the method further includes forming a gate structure over at least one of the first fin structure or the second fin structure.

While the disclosure has been described by way of example and in terms of the above embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method of making a semiconductor device, the method comprising:
   defining a first fin structure over a major surface of a substrate, wherein the first fin structure comprises a first material;
   defining a second fin structure over the major surface of the substrate, wherein defining the second fin structure comprises:
   forming a lower portion of the second fin structure, closest to the substrate, having the first material, and
   forming an upper portion of the second fin structure, farthest from the substrate, having a second material different from the first material, wherein the upper portion of the second fin structure directly contacts the lower portion of the second fin structure;
   forming a dielectric material over the substrate and between the first fin structure and the second fin structure; and
   removing the upper portion of the second fin structure, wherein removing the upper portion of the second fin structure comprises reducing a height of the second fin structure to be less than a height of the first fin structure,
   wherein removing the upper portion of the second fin structure comprises removing an entirety of the upper portion of the second fin structure, and
   removing the upper portion of the second fin structure comprises exposing a top surface of the lower portion above a top-most surface of the dielectric material.

2. The method of claim 1, wherein defining the first fin structure comprises defining the first fin structure comprising the first material different from a material of the substrate.

3. The method of claim 1, wherein forming the dielectric material comprises forming the dielectric material surrounding the lower portion of the second fin structure.

4. The method of claim 1, wherein forming the dielectric material comprises forming the dielectric material having a constant thickness.

5. The method of claim 1, wherein defining the first fin structure comprises epitaxially growing the first fin structure.

6. The method of claim 1, wherein removing the upper portion of the second fin structure comprises performing an etching process.

7. The method of claim 1, further comprising forming a gate structure on the first fin structure.

8. The method of claim 1, further comprising forming a gate structure on the second fin structure.

9. A method of making a semiconductor device, the method comprising:
   defining a first fin structure over a major surface of a substrate, wherein the first fin structure comprises a first material, and the first fin structure has a first height;
   defining a second fin structure over the major surface of the substrate, wherein the second fin structure has the first height, and defining the second fin structure comprises:
   forming a lower portion of the second fin structure, closest to the substrate, having the first material, and
   forming an upper portion of the second fin structure, farthest from the substrate, having a second material different from the first material;
   forming a dielectric material over the substrate and partially surrounding the first fin structure and the second fin structure; and
   removing the upper portion of the second fin structure,
   wherein removing the upper portion of the second fin structure comprises reducing a height of the second fin structure to a second height less than the first height, and
   removing the upper portion of the second fin structure comprises exposing a top surface of the lower portion of the second fin structure above a top-most surface of the dielectric material.

10. The method of claim 9, wherein defining the first fin structure comprises defining the first fin structure having the first material different from a material of the substrate.

11. The method of claim 9, wherein forming the upper portion of the second fin structure comprises forming the upper portion having the second material including silicon.

12. The method of claim 9, further comprising forming a gate structure over at least one of the first fin structure or the second fin structure.

13. The method of claim 9, wherein removing the upper portion of the second fin structure comprises a selective etching process.

14. A method of making a semiconductor device, the method comprising:
- growing a first fin structure over a substrate, wherein the first fin structure comprises a first material, and the first fin structure has a first height;
- defining a second fin structure over the major surface of the substrate, wherein the second fin structure has the first height, and defining the second fin structure comprises:
- growing a lower portion of the second fin structure, closest to the substrate, having the first material, and
- forming an upper portion of the second fin structure, farthest from the substrate, having a second material different from the first material;
- depositing a dielectric material over the substrate and between the first fin structure and the second fin structure; and
- removing the upper portion of the second fin structure to expose a top surface of the lower portion above a top-most surface of the dielectric material,
- wherein removing the upper portion of the second fin structure comprises reducing a height of the second fin structure to a second height less than the first height, and
- forming the dielectric material comprises forming the dielectric material having a constant thickness between the first fin structure and the second fin structure.

15. The method of claim 14, further comprising forming a gate structure over at least one of the first fin structure or the second fin structure.

* * * * *